United States Patent [19]
Hulsey et al.

[11] Patent Number: 4,747,161
[45] Date of Patent: May 24, 1988

[54] AM-RF TRANSMITTER WITH COMPENSATION FOR POWER SUPPLY VARIATIONS

[75] Inventors: Gilmer L. Hulsey, Greenville, N.C.; Bryan A. Weaver, Dallas, Tex.

[73] Assignee: Varian Associates, Inc., Palo Alto, Calif.

[21] Appl. No.: 832,807

[22] Filed: Feb. 25, 1986

[51] Int. Cl.$^4$ .............................................. H04B 1/04
[52] U.S. Cl. ................................... 455/108; 455/109; 455/127
[58] Field of Search ....................... 455/108, 109, 127; 332/37 R, 59; 330/297

[56] References Cited

U.S. PATENT DOCUMENTS

| | | | |
|---|---|---|---|
| 3,297,966 | 1/1967 | Bruene | 332/59 |
| 3,413,570 | 11/1968 | Bruene et al. | 455/108 |
| 4,085,389 | 4/1978 | Kuroda et al. | 455/108 |
| 4,199,723 | 4/1980 | Cummings | 455/108 |
| 4,319,359 | 3/1982 | Wolf | 455/108 |
| 4,449,103 | 5/1984 | Kyrian | 455/108 |

Primary Examiner—Michael A. Masinick
Attorney, Agent, or Firm—Stanley Z. Cole; Allan M. Lowe; John C. Yakes

[57] ABSTRACT

An AM-RF transmitter includes a transmitter stage having a DC power supply terminal energized by an AC to DC converter including reactances having a resonant frequency approaching frequencies of an information, modulating signal. The voltage applied by the supply to the DC power supply terminal is reduced to such an extent as to induce distortion in the transmitted AM-RF carrier in response to the transmitter stage being modulated by positive amplitude variations having frequencies that approach the resonant frequency. The amplitude of the transmitter stage modulation is increased when the distortion would otherwise occur to substantially prevent the distortion. The information signal is modified in amplitude by only AC coupling a replica of the DC power supply voltage variations to one input of a four quadrant multiplier, having a second input responsive to the information signal.

17 Claims, 1 Drawing Sheet

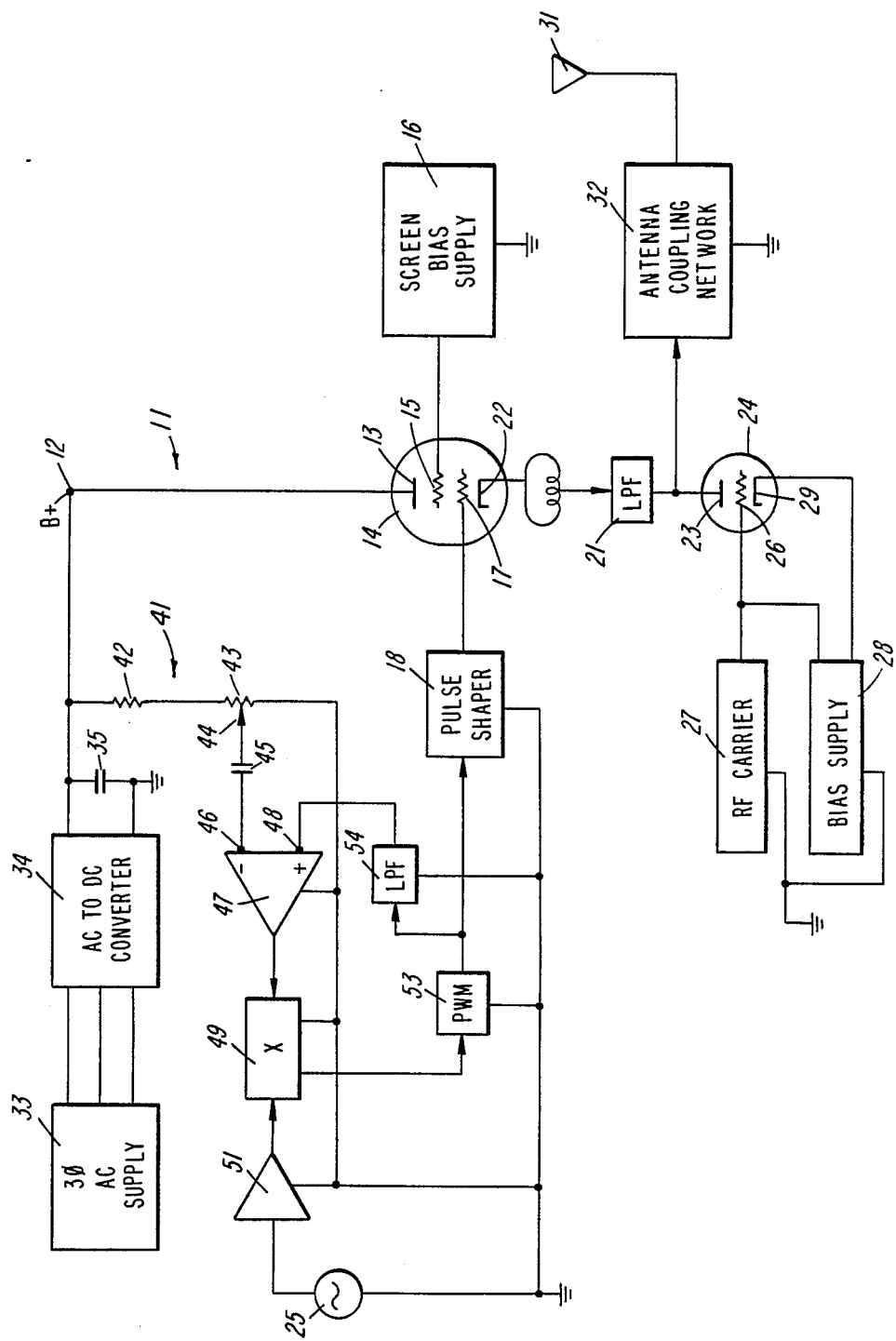

AM-RF TRANSMITTER WITH COMPENSATION FOR POWER SUPPLY VARIATIONS

TECHNICAL FIELD

The present invention relates to amplitude modulated (AM), radio frequency (RF) transmitters and more particularly to such a transmitter wherein compensation is provided for distortion due to variations in DC power supply voltage applied to a transmitter output stage.

BACKGROUND ART

Output stages of AM-RF transmitters are supplied with DC power supply voltages, typically derived from AC to DC converters. High power transmitters, i.e., transmitters with at least a 5 kilowatt output, are usually driven by three-phase AC power supply sources derived from AC mains or an AC generator.

It is known that variations in the DC supply voltage supplied to an AM-RF transmitter output stage cause distortion in a transmitted AM-RF carrier whereby modulation imposed on the carrier by an information signal prevents accurate reception and recovery of the information signal. The information signal is typically in the audio range and frequently constitutes voice or music signals. The distortion occurs because the power supply variations change the amplitude of the transmitted carrier wave envelope.

To avoid distortion causing variations in the DC power supply voltage supplied to an output stage of an AM-RF transmitter, there AC to DC converters are designed in such a way as to minimize ripple and other changes of the DC power supply voltage. Typically, the prior art has employed two different types of AC to DC converters to provide the stabilized DC power supply voltage.

One type of prior art AC to DC converter includes a three-phase transformer and associated full wave rectifiers which drive a low pass filter including a series inductor and shunt capacitor. In a second arrangement, that produces a DC voltage having less ripple than the first type of AC to DC converter, a three-phase to twelve-phase transformer arrangement is provided. Each of the twelve phases drives a full wave rectifier. DC voltages derived by the twelve different full wave rectifiers are supplied to a single, shunt capacitor having a very large capacitance.

Both prior art converters have resonant frequencies which we have found introduce distortion in the transmitted AM-RF carrier envelope. The resonant frequencies of the converters including the series inductor and shunt capacitor are in the 50 Hertz range. The resonance of these converters is caused by the reactances of the discrete, lumped parameter inductor and capacitor forming the low pass filter. The resonant frequency of the AC to DC converters including the twelve-phase transformers is considerably higher, approximately 100 Hertz. Resonance of the converters including the twelve-phase transformer is due to leakage and distributed inductance and capacitance of the transformer, in combination with the capacitance of the shunt, filter capacitor.

We have found that the reactances of both types of AC to DC converters interact with the information signal when the current demands of the transmitter output stage are greatest, i.e., at the time that the modulation imposed on the output stage has the greatest amplitude, and when the information signal frequency approaches or is approximately the same as the resonant frequency of the converter. (For the purposes of this specification and the claims appended hereto, the information signal frequency, $f_1$, is considered to approach the resonant frequency, $f_0$, when $f_1$ is equal to or less than $3f_0$ and when $3f_1$ is equal to or less than $f_0$.).

Even though the lumped parameter filters have a resonant frequency below the lowest audio frequency that modulates the transmitter, the distortion occurs because varying current demand occurs at syllabic frequencies, which are typically in the ½ to 25 Hertz range, i.e., in a frequency range approaching the resonant frequencies of the lumped parameter filters. In addition, when low audio frequencies of the information signal approach the lumped parameter filter resonant frequency, amplitude and phase distortion in the transmitted carrier occur because the filter has a high enough impedance to cause a downward fluctuation of the power supply voltage during the positive half cycle of the low frequency modulation imposed on the transmitter output stage.

The resonant frequency of the AC to DC converters including the twelve-phase transformer is in the same range as the lowest frequencies (typically about 100 Hz) of the audio modulating, information signal. Frequently, some resistive element is provided in the converter to broaden or flatten the resonant effect to avoid the distortion resulting from an interaction of the low audio frequencies of the modulating source and the power supply. In this situation, the degree of regulation of the AC to DC converter determines how much DC voltage fluctuation occurs with varying current demands as a function of modulation. With low power transmitters, AC to DC converters with sufficiently low impedance may be available. However, with higher powered transmitters, i.e., power ratings of at least 5 kilowatts, there are greater load variations making it quite difficult to provide a suitably stiff source for supplying the transmitter DC energizing voltage.

Hence, with transmitters employing both of the stated types of AC to DC converters, it is desirable to reduce distortion resulting from variations in the DC power supply voltage applied to an AM-RF transmitter output stage during modulation by low frequencies in the audio range.

It is, accordingly, an object of the present invention to provide an AM-RF transmitter having reduced carrier wave distortion in response to low audio modulating frequencies.

It is another object of the present invention to provide a new and improved AM-RF transmitter with distortion compensation resulting from variations in DC power supply voltage applied to the transmitter output stage due to an interaction between low frequencies of an audio modulating source and reactances of an AC to DC converter having a resonant frequency at least approaching frequencies of the modulating, information source for the transmitter.

An additional object of the invention is to provide a new and improved AM-RF transmitter with distortion compensation resulting from variations in DC energizing voltage applied to the transmitter output stage, wherein the compensation is provided with an inexpensive, light weight and small circuit.

DISCLOSURE OF INVENTION

In accordance with one aspect of the invention, there is provided an apparatus for transmitting a radio frequency carrier amplitude modulated by an information signal wherein a modulation responsive transmitter stage has a DC power supply terminal, a carrier input terminal and an antenna output terminal. A DC power supply including an AC to DC converter is connected to the DC power supply terminal of the transmitter stage. The converter includes reactances having a resonant frequency. The converter is such that the DC voltage applied by the supply to the DC power supply terminal is reduced in response to positive amplitude variations approaching or having the same approximate frequency as the resonant frequency being coupled to the DC power supply terminal. The reduction is sufficient to induce distortion in the transmitted amplitude modulated radio frequency carrier The apparatus includes means for modifying the amplitude of the modulation resulting from the information signal, as it modulates the output stage. The amplitude modification is such that when the modulation has positive amplitude variations in a frequency range approaching or approximately equal to the resonant frequency the modulation is increased by an amount to substantially prevent the distortion.

In a preferred embodiment, the amplitude of the information signal is modified in response to a replica of variations in the voltage at the DC power supply terminal so that the amplitude of the modulation increases while the reduced DC voltage is applied by the supply to the DC power supply terminal. The replica of variations in the voltage at the DC power supply terminal is derived by a voltage divider that is connected to the terminal. The divider has a tap that is connected so there is only AC coupling of the power supply variation replica to one input of a signal combining network, having a second input responsive to the information signal. The signal combining network is a variable gain device, preferably in the form of a four quadrant multiplier. The input to the four quadrant multiplier responsive to the replica is also responsive to a DC, offset voltage which can either be a constant, predetermined DC level or a varying DC level indicative of the an RMS like function of the amplitude of the information signal.

The above and still further objects, features and advantages of the present invention will become apparent upon consideration of the following detailed description of one specific embodiment thereof, especially when taken in conjunction with the accompanying drawing.

BRIEF DESCRIPTION OF DRAWING

The sole FIGURE is a combined block and circuit diagram of a transmitter in accordance with the preferred embodiment of the invention.

BEST MODE FOR CARRYING OUT THE INVENTION

Reference is now made to the single FIGURE wherein the AM-RF transmitter embodying the present invention is illustrated as including an output stage 11, including DC power supply terminal 12, connected to the plate or anode 13 of tetrode 14, having a screen grid 15 responsive to a DC output voltage of screen bias supply 16. Tetrode 14 is a pulse power amplifier having control grid 17 responsive to variable duration output pulses of pulse shaper 18. In general, the output pulses of shaper 18 have a constant amplitude. However, in response to the durations of pulses supplied to shaper 18 being less than a predetermined interval, the amplitude of the output of the shaper is decreased, for reasons described in the copending, commonly assigned application entitled "RF-AM Transmitter With Pulse Width Modulator" Ser. No. 832,629 filed 2/25/86. Tetrode 14 responds to the pulses at the output of shaper 18 to control the application of current from DC power supply terminal 12 to low pass filter 21, having an input terminal connected to cathode 22 of tetrode 14.

Generally, tetrode 14 is driven into and out of saturation by the output pulses of shaper 18 and low pass filter 21 responds to the current pulses flowing in the cathode-anode path of the tetrode, to integrate the pulses and supply a varying continuous wave voltage to anode 23 of power transmitting and amplitude modulating triode 24. The voltage variations at anode 23 are a replica of the variations of audio frequency source 25, typically a voice or music source. Triode 24 includes grid 26, responsive to RF carrier 27, and DC bias supply 28, which is also coupled to cathode 29 to bias tube 24 into Class C operation, although it is to be understood that tube 24 can be biased into Class AB or B operation. Triode 24 responds to the voltages applied thereto to derive an AM-RF modulated carrier at anode 23. The AM-RF carrier at anode 23 is supplied to antenna 31 by way of antenna coupling network 32, having input and output terminals respectively connected to the anode and antenna.

The DC voltage at terminal 12 is derived from three-phase AC supply 33, which can be any suitable source, such as a motor driven generator or a mains. Three-phase supply 33 drives AC to DC converter 34, having an output supplied to shunt storage capacitor 35 and DC power supply terminal 12 for output stage 11. Converter 34 can be a three-phase converter, wherein each phase is provided with a full wave rectifier for deriving a DC voltage which is supplied to a lumped parameter series inductor, connected to shunt capacitor 35. In the alternative, AC to DC converter 34 includes a three-phase to twelve-phase transformer. Each of the twelve phases drives a full wave rectifier; each full wave rectifier derives a DC voltage that is applied across capacitor 35. In both cases, converter 34 has a resonant frequency. The resonant frequency of the converter including a lumped parameter inductance is primarily determined by the values of the inductance and shunt capacitor 35; it is typically lower than the lowest frequency of audio information source 25, typically being in the 25 to 50 Hertz range. If, however, AC to DC converter 34 includes a three-phase to twelve-phase transformer, the only inductance of the converter is the leakage and distributed inductance thereof. The leakage and distributed inductance and capacitance of the transformer combine with the capacitance of capacitor 34 to provide a resonant frequency of approximately 100 Hertz, which is in the range of the audio frequencies of source 25.

For both types of configurations for converter 34, the current demands of tubes 14 and 24 on the voltage at terminal 12 are such that the voltage at terminal 12 is decreased when the frequency of source 25 approaches the resonant frequency of converter 34 and when positive amplitude variations of the modulation are imposed on tube 24. The reduction in the voltage at terminal 12 causes a reduction in the voltage between anode 23 and cathode 28 of transmitting triode 24, so that the carrier wave transduced by antenna 31 is distorted. The reduction in voltage at terminal 12 occurs for frequencies of source 25 which approach the resonant frequency of converter 34. In addition, the reduction in voltage at terminal 12 occurs due to an interaction between syllabic frequencies of source 25 and the reactances of converter 34.

In accordance with the present invention, this tendency for distortion is obviated by increasing the amplitude of the voltage of information, modulating source 25 by an amount indicative of the decrease in amplitude of the voltage at terminal 12. The increase in voltage of source 25 is for the half cycle of the source which results in positive half cycle modulation of output stage 11, i.e., the half cycle of source 25 which causes a peak current to be supplied by low pass filter 21 to anode 23 of tube 24.

To these ends, a replica of only AC variations at terminal 12 are derived and supplied to a variable gain circuit for the amplitude of audio source 25. The replica of the AC variations at terminal 12 is derived by connecting resistive voltage divider 41, including fixed resistor 42 and potentiometer 43 between terminal 12 and ground. Potentiometer 43 includes slider 44 that is adjusted in position to provide the proper gain factor for modification of the amplitude of source 25 to eliminate the distortion. The voltage at slider 44 is only AC coupled through capacitor 45 to an inverting input 46 of summing amplifier 47.

Summing amplifier 47 includes non-inverting input terminal 48 responsive to a DC voltage, which can either be predetermined or a variable level that tracks, as an RMS like function, amplitude variations of information source 25. Summing amplifier 47 polarity inverts the AC signal coupled by capacitor 45 to terminal 46, to derive a positive DC output voltage having an amplitude that is modified by variations in the voltage at DC power supply terminal 12. In response to the voltage at terminal 12 decreasing due to the interaction of the modulation imposed by low frequencies of source 25 on transmitting triode 24 when the triode is drawing maximum current, the output of summing amplifier 47 is increased.

The output signal of summing amplifier 47 is supplied to an amplitude modifying circuit for modulating signal source 25. The amplitude modifying circuit for audio signal source 25 comprises four quadrant multiplier 49, having one input responsive to the output signal of summing amplifier 47 and a second input responsive to an output signal of isolating, audio amplifier 51, in turn responsive to signal source 24. Four quadrant multiplier 49 derives a bipolarity output signal such that in response to both input signals thereof having the same polarity, the multiplier output signal is positive; in response to the input signals to multiplier 49 having opposite polarities, the multiplier derives a negative polarity output signal. The output signal of multiplier 49 tracks the frequency of source 25, but modifies the amplitude of source 25, so that the output signal of multiplier 49 has an increased amplitude relative to the amplitude of source 25 in response to decreases in the voltage at power supply terminal 12, as occurs in response to an interaction of low frequencies of the modulating signal for tube 24 during large amplitude modulation intervals.

The bipolarity output signal of four quadrant multiplier 49 is applied to pulse width modulator 53. Pulse width modulator 53 is preferably of the type described in the commonly assigned, copending application entitled "Pulse Width Modulator For AM-RF Transmitter" Ser. No. 832,630 filed 2/25/86. Pulse width modulator 53 preferably is a variable frequency pulse width modulator, wherein the frequency of the variable duration pulses derived by it is a function of the frequency and an RMS like function of the amplitude of the input thereof. The width of pulses derived by modulator 53 is a function of the instantaneous amplitude of the input of the modulator. The output of pulse width modulator 53 is applied to pulse shaper 18 and to low pass filter 54.

Because pulse width modulator 53 derives a bilevel signal which varies between a zero level and a finite level, the output of low pass filter 54 is an RMS like function of the amplitude of the input of the pulse width modulator and of source 25, to a large extent. As indicated supra, pulse shaper 18 responds to the output of modulator 53 to generally supply constant amplitude, variable width pulses to grid 17 to drive tetrode 14 between cut off and saturation. In response to the output pulse of modulator 53 having a duration less than a predetermined value, the output of pulse shaper 18 is decreased in amplitude, causing tetrode 14 not to be driven fully into saturation.

While there has been described and illustrated one specific embodiment of the invention, it will be clear that variations in the details of the embodiment specifically illustrated and described may be made without departing from the true spirit and scope of the invention as defined in the appended claims. For example, voltage divider 41 can be formed as a capacitive device, which obviates the need for coupling capacitor 45. Also, the present invention is not limited to plate modulated transmitters, and in particular is not limited to plate modulated transmitters including pulse width modulators, pulse shapers and low pass filters, although the particular pulse width modulator and pulse shaper employed contribute to distortion reduction due to effects other than variations in the voltage at terminal 12.

We claim:

1. Apparatus for transmitting a radio frequency carrier amplitude modulated by an information signal comprising a transmitter stage having a DC power supply terminal, and an antenna output terminal on which is derived a signal in the form of an amplitude modulated radio frequency carrier, a DC power supply including an AC to DC converter connected to said DC power supply terminal, said converter including reactances having a resonant frequency, the converter being such that the DC voltage applied by said supply to said DC power supply terminal is reduced to such an extent as to induce distortion in the amplitude modulated radio frequency carrier at the antenna output terminal in response to positive amplitude variations of the information signal approaching the resonant frequency being coupled to the DC power supply terminal, and means connected between the source of the information signal and the transmitter stage for modifying the amplitude of the information signal applied to the transmitter stage so the amplitude of the transmitter stage amplitude modulation increases when the transmitter stage amplitude modulation approaches or is approximately equal to the resonant frequency and the transmitter stage is modulated by positive amplitudes, the information signal amplitude being modified so said distortion is substantially prevented.

2. The apparatus of claim 1 wherein said means for modifying includes means for changing the amplitude of the information signal in response to a replica of variations in the voltage at the DC power supply terminal so that the amplitude of the modulation increases while said reduced DC voltage is applied by said supply to said DC power supply terminal.

3. The apparatus of claim 2 wherein said means for modifying includes signal combining means having first and second inputs respectively responsive to said information signal and the replica of variations in the voltage at the DC power supply terminal for deriving an output signal having an amplitude (a) directly proportional to the information signal and a predetermined constant while there is no reduction in the DC voltage applied by said supply to said DC power supply terminal and (b) proportional to the product of a replica of the information signal and a factor directly proportional to said reduction in the DC voltage while said reduction is occurring.

4. The apparatus of claim 2 wherein said means for modifying includes signal combining means having first and second inputs respectively responsive to said information signal and the replica of variations in the voltage at the DC power supply terminal for deriving an output signal having an amplitude (a) directly proportional to the product of an RMS like function of the amplitude of the information signal and the instantaneous amplitude of the information signal while there is no reduction in the DC voltage applied by said supply to said DC power supply terminal and (b) directly proportional to the product of a replica of the information signal and a factor directly proportional to said reduction in the DC voltage while said reduction is occurring.

5. Apparatus for transmitting a radio frequency carrier amplitude modulated by an information signal derived by an information signal source, comprising a transmitter stage having a DC power supply terminal, a modulation input terminal and an antenna output terminal on which is derived a signal in the form of an amplitude modulated radio frequency carrier, a DC power supply including an AC to DC converter connected to said DC power supply terminal, said converter including reactances having a resonant frequency, the converter being such that the DC voltage applied by said supply to said DC power supply terminal is reduced to such an extent as to induce distortion in the transmitted amplitude modulated radio frequency carrier in response to positive amplitude variations approaching the resonant frequency being coupled to the DC power supply terminal, variable gain means having an input responsive to the information signal, voltage divider means for only AC coupling a replica of variations at the DC power supply terminal to a second input terminal of the variable gain means, the variable gain means deriving an output signal wherein the amplitude of the signal at the first input terminal thereof is modified by a factor proportional to the signal at the second input terminal thereof, and means for coupling the output signal of the variable gain means to the modulation input terminal.

6. The apparatus of claim 5 wherein the variable gain means includes a four quadrant multiplier, said voltage divider means including means for inverting the polarity of the AC variations so the replica thereof is coupled to the second input terminal with a polarity opposite to the polarity of the variations at the DC power supply terminal, and means for supplying a DC voltage to said second terminal.

7. The apparatus of claim 6 wherein the means for supplying a DC voltage to said second terminal includes means for deriving an RMS like function of the amplitude of the information signal.

8. In combination, means for deriving a carrier that is amplitude modulated by an information signal, said means for deriving having a DC power supply terminal, a DC power supply having an output terminal on which is derived a DC voltage, the DC power supply being of a type that the DC voltage of the DC power supply output terminal is reduced in response to electrical energy in a predetermined frequency band being coupled to the DC power supply output terminal, the DC power supply terminal of the means for deriving being connected to be powered by the voltage at the DC power supply output terminal, the means for deriving being arranged so that the DC power supply terminal thereof and the DC power supply output terminal are from time to time responsive to frequencies resulting from the information source being in the predetermined range while the amplitude modulated carrier is being derived by the means for deriving, the amplitude of the derived amplitude modulated carrier being decreased to introduce distortion in the amplitude modulated carrier in response to the reduced voltage at the DC power supply output terminal, and means coupled to a source of the information signal and the means for deriving for increasing the amplitude of the information signal amplitude modulating the carrier to substantially prevent the distortion in response to the DC power supply voltage decreasing due to the frequencies in the predetermined range being coupled to the power supply output terminal.

9. The combination of claim 8 wherein the amplitude increasing means includes means for increasing the amplitude of the information signal only while the amplitude modulated carrier has the same polarity as the DC voltage and the information signal.

10. A method of deriving a carrier amplitude modulated by an information signal, the carrier being derived from an amplitude modulator powered by a DC voltage from a DC power supply, the DC voltage having a tendency to decrease in response to frequencies in a predetermined band being coupled by the information signal to the modulator, the decrease in the DC voltage having a tendency to introduce distortion in the amplitude modulated carrier, the method comprising the step of increasing the amplitude of the information signal that modulates the carrier while the information signal frequency is in the predetermined band to substantially overcome the tendency for the amplitude modulated carrier to be distorted.

11. The method of claim 10 wherein the modulator has a unipolar DC power supply terminal of predetermined polarity, the amplitude of the information signal being increased only while the modulator is deriving the predetermined polarity of the amplitude modulated carrier.

12. A modulator responsive to an information signal, and a carrier and having a power supply input terminal responsive to a DC voltage at a power supply output terminal, the DC voltage at the output terminal decreasing in response to electrical energy in a predetermined frequency range being coupled to the output terminal, the modulator comprising means responsive to the information signal, carrier and DC voltage for deriving a carrier amplitude modulated by the information signal, the information signal being coupled to the modulator power supply input terminal, the carrier amplitude having a tendency to be distorted in response to the DC voltage at the output terminal decreasing while the information signal is in the predetermined frequency range, and means for increasing the amplitude of the information signal while the information signal is in the predetermined frequency range to overcome the tendency for the amplitude modulated carrier to be distorted.

13. The modulator of claim 12 wherein the modulator has a unipolar DC power supply terminal of predetermined polarity, the means for increasing including means for increasing the amplitude of the information signal only while the modulator is deriving the predetermined polarity of the amplitude modulated carrier.

14. The modulator of claim 13 wherein the means for increasing includes means for varying the amplitude of the information signal in response to decreases in the DC voltage at the power supply output terminal.

15. The modulator of claim 12 wherein the means for increasing includes means for varying the amplitude of the information signal in response to decreases in the DC voltage at the power supply output terminal.

16. The modulator of claim 15 wherein the means for varying includes comparison means having a first input terminal AC coupled to a replica of the DC voltage at the power supply terminal and a second input terminal responsive to a DC level.

17. The modulator of claim 16 further including means responsive to the input signal for supplying the second input terminal with a DC level that tracks amplitude variations of the information signal.

* * * * *